United States Patent [19]

Ohiwa

[11] Patent Number: 5,245,157
[45] Date of Patent: Sep. 14, 1993

[54] MICROWAVE PLASMA PROCESSING OR SEMICONDUCTOR DEVICES
[75] Inventor: Kiyoshi Ohiwa, Tokyo, Japan
[73] Assignee: Fuji Electric Co., Ltd., Kawasaki, Japan
[21] Appl. No.: 666,522
[22] Filed: Mar. 11, 1991
[30] Foreign Application Priority Data
Mar. 12, 1990 [JP] Japan .................................. 2-60426
[51] Int. Cl.[5] .............................................. B23K 9/00
[52] U.S. Cl. .......................... 219/121.43; 219/121.42; 219/121.59; 156/345; 156/646; 204/298.37
[58] Field of Search ....................... 219/121.42, 121.43, 219/121.59; 304/298.37, 298.38; 156/345, 646, 643

[56] References Cited
U.S. PATENT DOCUMENTS

| 4,952,273 | 8/1990 | Popov ............................ | 204/298.37 |
| 5,016,564 | 5/1991 | Nakamura et al. ............. | 204/298.37 |
| 5,032,202 | 7/1991 | Tsai et al. ....................... | 204/298.37 |

FOREIGN PATENT DOCUMENTS

3031481 2/1991 Japan ............................... 204/298.37

Primary Examiner—Mark H. Paschall
Attorney, Agent, or Firm—Spencer, Frank & Schneider

[57] ABSTRACT

A plasma processing is performed using a plasma generation chamber into which is introduced a gas for generating plasma by a resonant effect between a microwave and a magnetic field. A processing chamber communicates with the plasma generation chamber and a single excitation solenoid disposed to surround the plasma generation chamber in a coaxial relationship therewith and movable relative to the plasma generation chamber. The processing includes generating plasma while controlling the magnitude of the electric current flowing through the single excitation solenoid to be in a range in which the density of the generated plasma is decreased with the increase of the current, and processing a specimen to be processed disposed within the processing chamber.

8 Claims, 8 Drawing Sheets

EVACUATION SYSTEM

FIG. 8

MICROWAVE PLASMA PROCESSING OR SEMICONDUCTOR DEVICES

BACKGROUND OF THE INVENTION

1. Field of the Invention

The present invention relates to a microwave plasma processing apparatus used in the production of semiconductor devices for dry etching or forming a thin film by CVD (Chemical Vapor Deposition) by utilizing microwave plasma and the operation method thereof.

2. Description of the Prior Art

The microwave plasma processing apparatuses for processing the surface of a substrate by utilizing ECR (Electron Cyclotron Resonance) plasma has attracted much attention in the field of semiconductor device manufacture. One of the most important features of ECR plasma processing resides in the fact that the electrons are accelerated by the resonance effect between the magnetic field and the microwaves so that the kinetic energy of the accelerated electrons ionizes a gas, thereby creating high-density plasma. Each of the electrons excited by the microwaves makes a rotary motion about a line of magnetic force. In this case, the condition that the centrifugal force and Lorenz force are balanced is defined as the ECR condition. This condition is expressed by $$\omega/B = q/m$$

where the centrifugal force and the Lorenz force are expressed by $mr \cdot \omega^2$ and $-qr \cdot \omega B$, respectively, wherein,
 $\omega$: angular frequency of the microwaves;
 B: magnetic flux density; and
 q/m: specific charge of electron.
In general, the microwave frequency is 2.45 GHz which is industrially accepted. In this case, the resonance magnetic flux density is 875 gauss.

Figure 1:
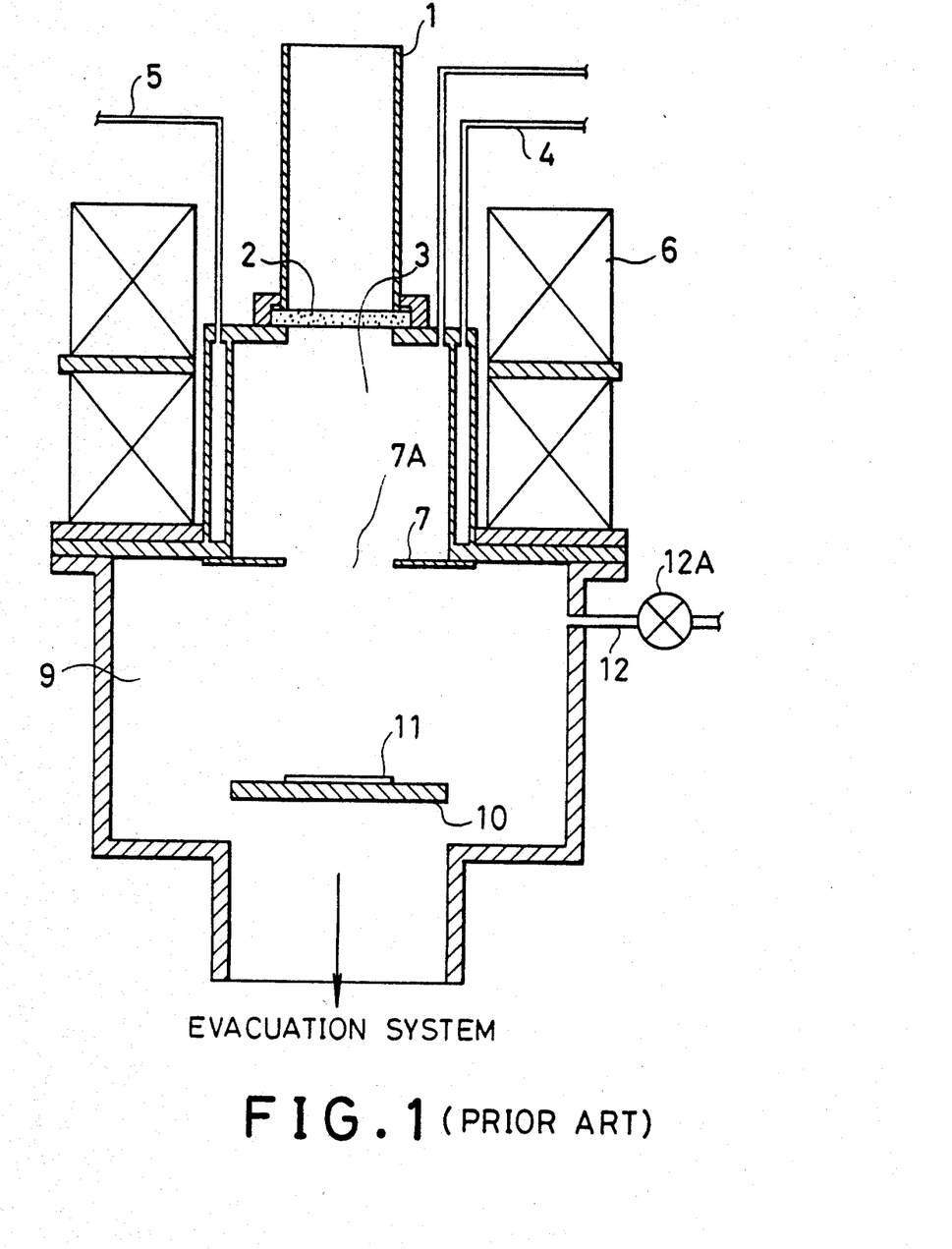
FIG. 1 is a schematic sectional view illustrating the construction of a conventional ECR plasma processing apparatus.

FIG. 1 illustrates a sectional view used to explain the construction of a conventional ECR plasma apparatus. The microwaves generated by a microwave generator (not shown) are introduced into a plasma generation chamber 3 through a waveguide 1. A gas such as $N_2$, $O_2$, Ar or the like for generating plasma is introduced through a gas supply pipe 4 into the plasma generation chamber 3. Disposed between the waveguide 1 and the plasma generation chamber 3 is a vacuum window 2 such as quartz in order to gas-tightly separate the waveguide 1 under atmospheric pressure and the plasma generation chamber 3 which is evacuated by an evacuation system (not shown). Also disposed at the lower end of the plasma generation chamber 3 is a metal plate 7 with a large opening 7A. This plate 7 and the plasma generation chamber 3 define a half-opened microwave resonator. Excitation solenoid 6 surrounds the outer surface of the resonator in such a way that a magnetic field adapted to satisfy the ECR condition is generated, whereby plasma is produced within the resonator chamber. The plasma thus generated is forced into a processing chamber 9 along the lines of magnetic force and is directed toward a substrate stand 10. For example, monosilane gas ($SiH_4$) is introduced into the processing chamber 9 through a gas supply means including a valve 12A and a supply pipe 12 so that the introduced gas is activated by the plasma. Then, the activated species react with a substrate 11 which is a specimen to be processed, whereby a thin film is formed over the surface of the substrate. When, an etching gas is supplied through the gas supply pipe 4 instead of $N_2$ or the like the apparatus can be used for etching the surface of a substrate.

Figure 2:
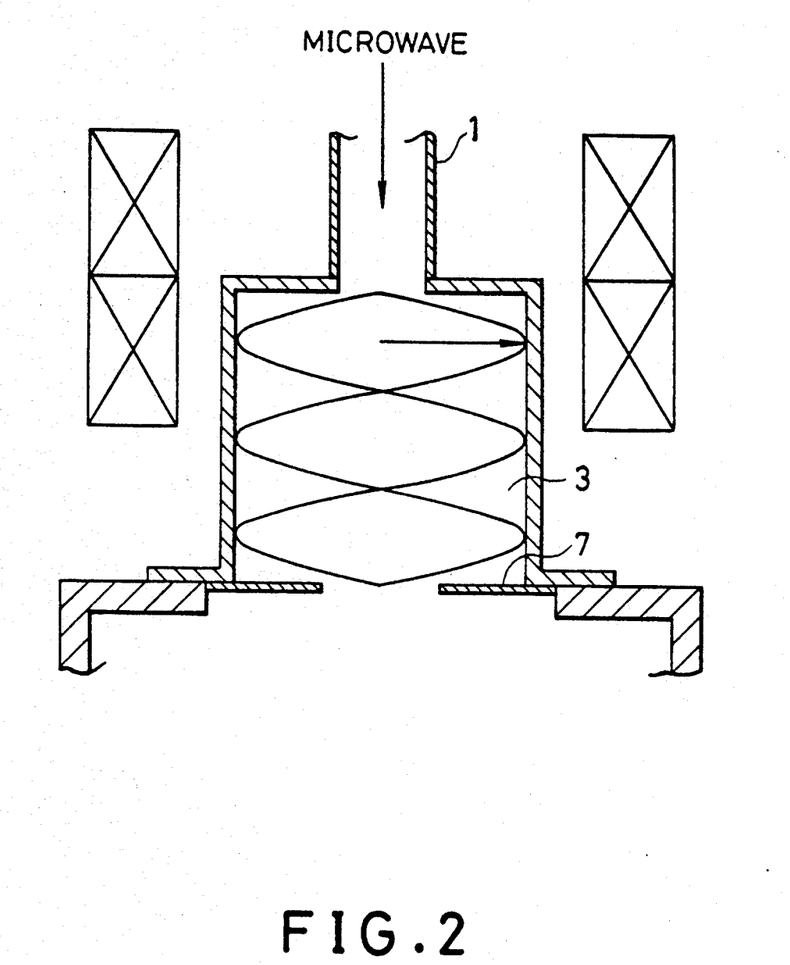
FIG. 2 is a sectional view for illustrating the standing wave form showing the electric field strength within a resonator capable of exhibiting the resonant mode $TE_{113}$ of the microwave.

Prior to the description of the problems resulting from the construction and the operation of the ECR plasma etching apparatus or the CVD apparatus of the type described above, how a plasma is generated will be described. In the case of the ECR plasma etching apparatus or the CVD apparatus, in order to carry out the efficient etching or growth of a thin film by increasing the plasma density, a magnetic field region which satisfies the ECR condition must be established within the plasma generation chamber. However, since the length of the axial direction of the excitation solenoid is limited this magnetic field region is impossible to expand into the whole space of the plasma generation chamber as in the case of the length of the solenoid in the axial direction being limitless. The above-mentioned magnetic field region exists within a limited space only and the shape and the position of the region in the axial direction of the plasma generation chamber are determined in response to the outer and inner diameters, the height, a number of turns of the solenoid and other design factors and the magnitude of the current flowing through the excitation solenoid. Furthermore, the generation of the plasma is dependent upon the outer product of the strength of electric field and the magnetic flux density (E×B), so that the position of the magnetic field region (termed as the resonance magnetic field region hereinafter in this specification) relative to the microwave electric field strength distribution becomes a very important factor influencing the speed of the substrate surface processing as well as the quality of the processed surface, for example, the growth rate of a thin film over the surface of a substrate and film qualities such as thickness distribution of the film grown and the density of film. The microwave electric field strength distribution within the plasma generation chamber is dependent upon the shape and size of the plasma generation chamber and the matching condition between the microwaves and the load. As an example of a microwave electric field strength distribution, FIG. 2 illustrates a schematic view of a microwave electric field strength distribution when the plasma generation chamber is constructed as a resonator creating the resonance mode $TE_{113}$. In this case, within the plasma generation chamber 3, there exist three crests of the standing microwave. The electric field strength in the axial direction of the plasma generation chamber is equal to the amplitude of the standing wave and which is decreased in the radial direction of the chamber. It is thought, therefore, that when the space in which the resonance magnetic field region is created is controlled by varying the magnitude of the current flowing through the solenoid, the ECR plasma generation efficiency as well as the distribution of the plasma density within the plasma generation chamber can be controlled. So far based only on the above described technical idea, only the solenoid current is controlled to determine an optimum magnitude so that the overall characteristics of the quality of a thin film, the film growth rate, the distribution of the thickness of the grown film, become optimum, but there exists the problem that the optimum overall characteristics cannot be attained when only the solenoid current is controlled.

SUMMARY OF THE INVENTION

In view of the above, an object of the present invention is to provide a plasma processing apparatus having improved overall characteristics.

Another object of the present invention is to provide an optimum method for operating the plasma processing apparatus of the type described above.

In the first aspect of the present invention, a plasma processing apparatus comprises:

microwave generation means;

microwave transmission means for transmitting the microwave generated by said microwaves generation means;

a plasma generation chamber communicated with said microwave transmission means and having gas supply means and an opening defined at the end portion in opposing relationship with said microwave transmission means;

a single excitation solenoid disposed around said plasma generation chamber in coaxial relationship therewith and for defining a magnetic field for generating plasma of gas introduced into said plasma generating chamber by the resonant effect with said microwaves a processing chamber communicated with said plasma generation chamber through said opening and for processing a surface of a substrate disposed therein with said plasma; and displacing means for varying the position of said excitation solenoid in the axial direction relative to said plasma generation chamber.

Here, a position of a region, in which the magnetic field produced by the excitation solenoid satisfies an electron cyclotron resonance condition, may be adjusted relative to a microwave electric field strength within the plasma generation chamber by displacing the excitation solenoid relative to the plasma generation chamber.

The magnitude of the current flowing through the excitation solenoid may be variable.

The processing chamber may be provided with gas supply means.

In a second aspect of the present invention, a method for operating a plasma processing apparatus including a plasma generation chamber into which is introduced a gas for generating plasma by a resonant effect between microwaves and a magnetic field, a processing chamber communicated with the plasma generation chamber, and a single excitation solenoid disposed to surround said plasma generation chamber in coaxial relationship therewith and movable relative to the plasma generation chamber comprises:

generating plasma by determining the magnitude of the electric current flowing through said excitation solenoid in a range in which the density of the generated plasma is decreased with the increase of said current; and processing a specimen to be processed disposed within said processing chamber.

Here, a method may further comprise the steps of varying the magnitude of said current flowing through said solenoid within said range; changing the position of said solenoid in the axial direction thereof, thereby repeating said processing said specimen; repeating said steps of varying the magnitude of the current, changing the position of said solenoid and processing said specimen; determining the magnitude of said current and said position of said solenoid; and processing said specimen.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 3:
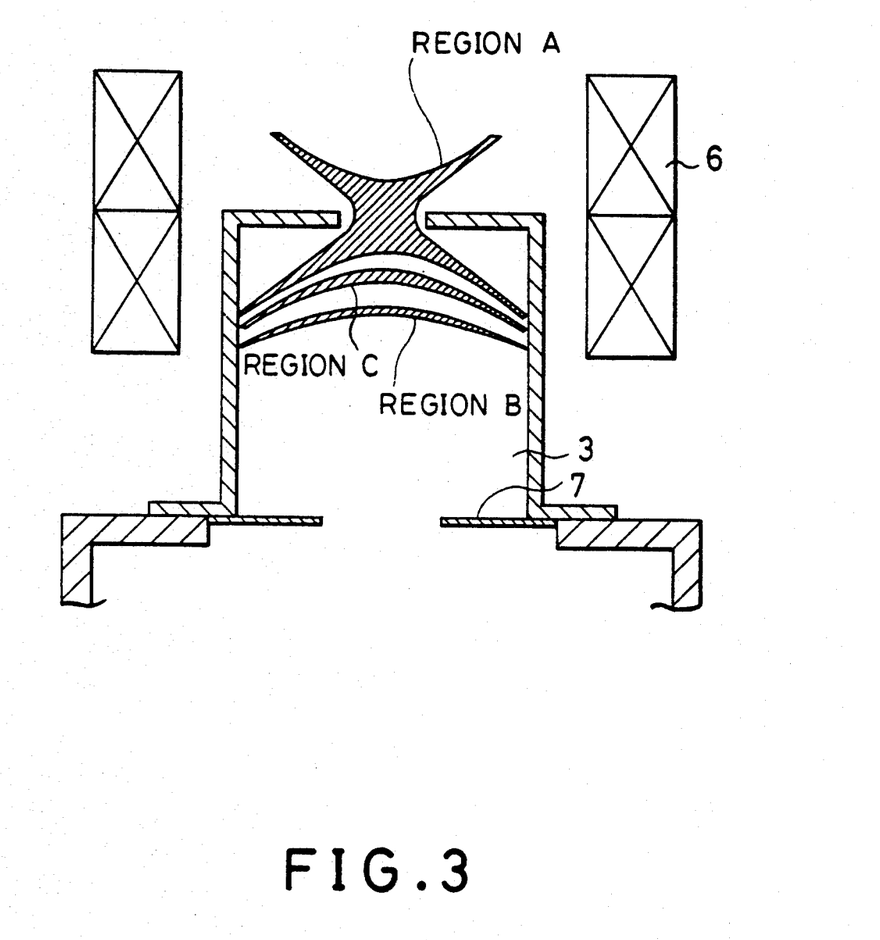
FIG. 3 is a diagram illustrating resonance magnetic field regions within a plasma generation chamber.
Figure 4:
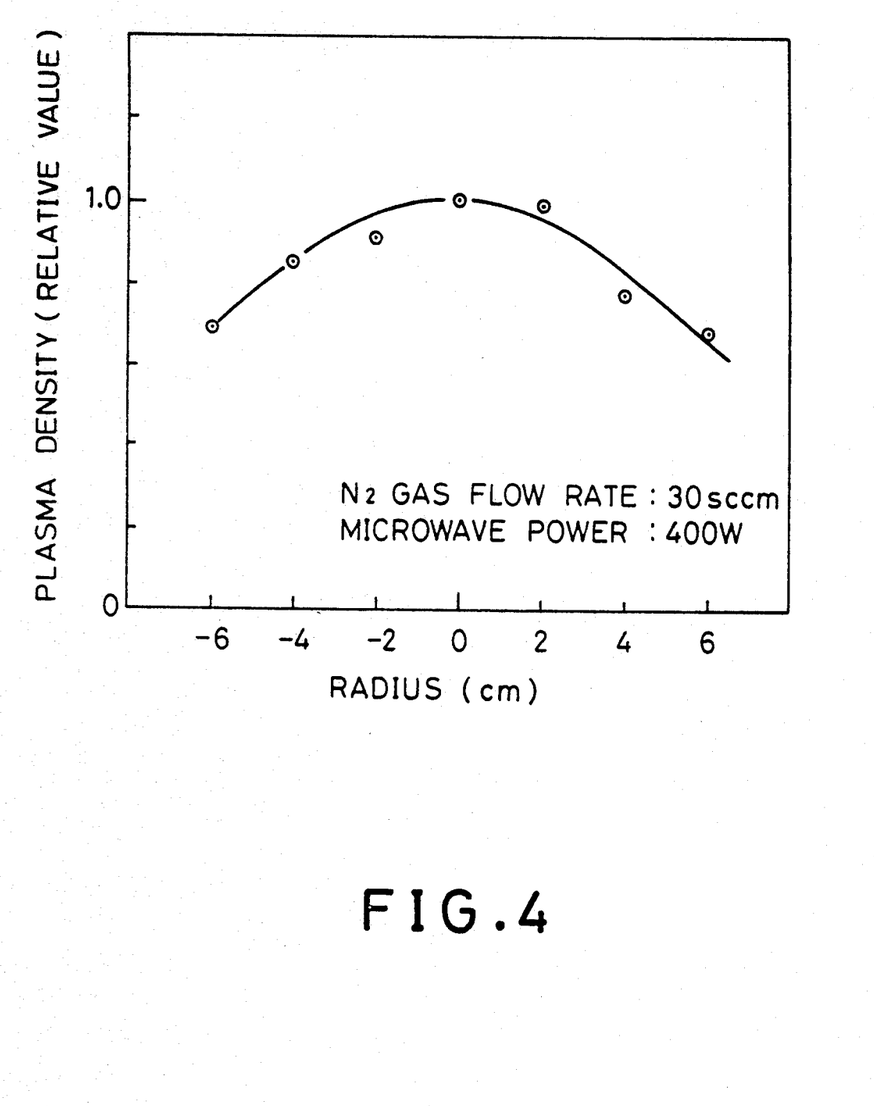
FIGS. 4 and 5 are diagrams illustrating the respective distributions of the plasma density in the radial direction of the plasma generation chamber when the resonance magnetic fields regions are created in the regions A and B as shown in FIG. 3.
Figure 5:
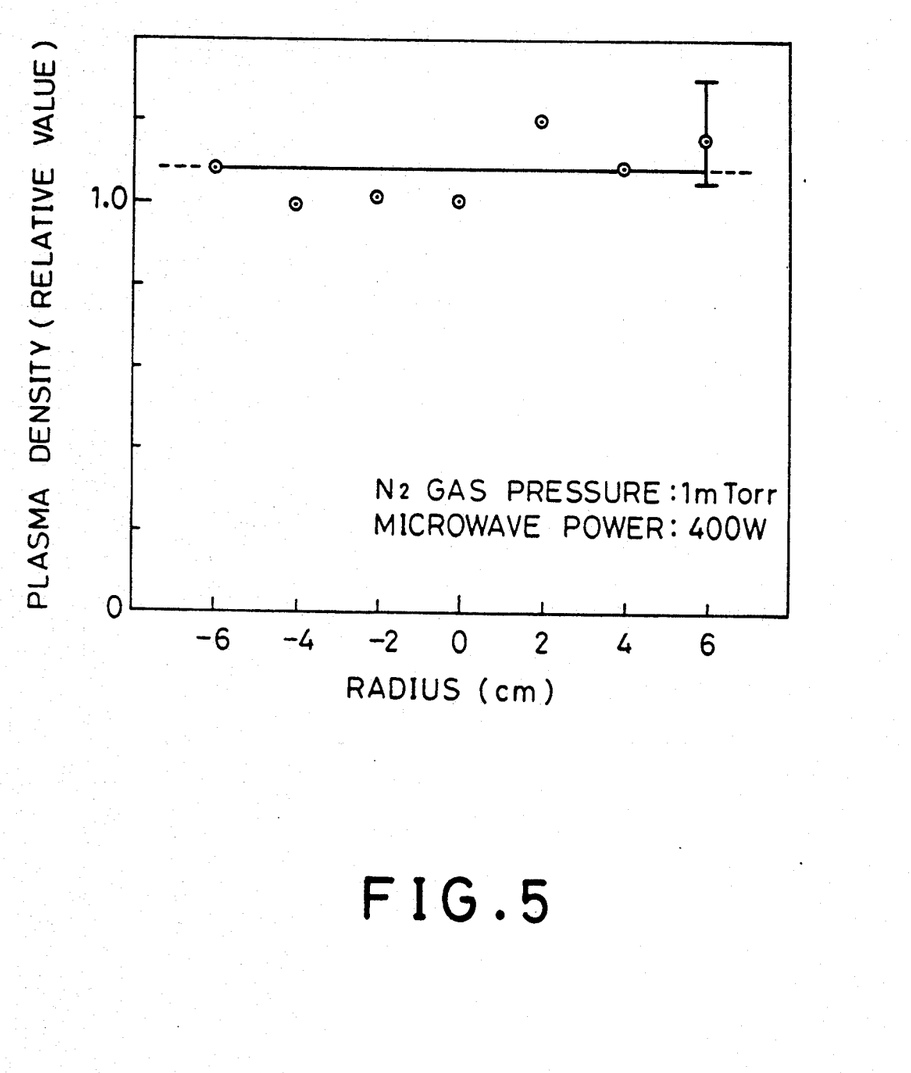

The inventors made extensive experiments and detailed analyses of the distribution of the magnetic flux density generated within the plasma generation chamber by flowing current through the excitation solenoid. The calculated results are shown in FIG. 3, the hatched regions show the resonance magnetic field regions in which the error of the magnetic flux, with respect to the magnetic flux density of 875 gauss resonant with microwaves with 2.45 GHz is within ±1%. This resonance magnetic field region varies in response to the magnitude of the current flowing through the solenoid. When the current is made to flow through the solenoid in such a way that the ECR condition is satisfied in the vicinity of the center of the solenoid in the longitudinal direction, as shown as the region A, the resonance magnetic field region is thick in the axial direction of the solenoid in the vicinity of the axis but the thickness is suddenly decreased in the radial direction, so that the plasma has a tendency to concentrate in the vicinity of the axis of the solenoid. On the other hand, when the current is made to flow through the solenoid in such a way that the resonance magnetic field region is created in the vicinity of the ends of the solenoid, as shown as the region B, the thickness of the resonance magnetic field region becomes thin in the vicinity of the axis of the solenoid, but the thickness is substantially uniform in the radial direction. The region C illustrates the resonance magnetic field region when the current flows through the solenoid in such a way that the resonance magnetic field region is defined between the end and the space in the vicinity of the center of the axis of the solenoid. In this specification, the mode of the plasma generation by the magnetic field defined with the region A is defined as the mode I and the mode of the plasma generation by the magnetic field defined with the region B, the mode II. When a plasma is created in the mode I, the efficiency of plasma generation is high so that a plasma with a relatively high density can be obtained. In the case of the mode II, the efficiency of the plasma generation becomes less than in the mode I, but the distribution of the plasma density in the radial direction becomes uniform. FIGS. 4 and 5 illustrate the distribution of the density of the plasmas generated by the modes I and II, respectively, in the radial direction of the plasma generation chamber under the conditions that the pressure of $N_2$ is 1 mTorr, the flow rate is 30 sccm and the power of the microwaves is 400 W. In the mode I, a deviation of about 30% in the plasma density occurs in the radial direction, but in the mode II, a deviation is within about 10%. In FIGS. 4 and 5, the plasma density is plotted as a relative value where the density at the axis is unity, but the absolute value is higher in mode I than mode II.

Figure 6A:
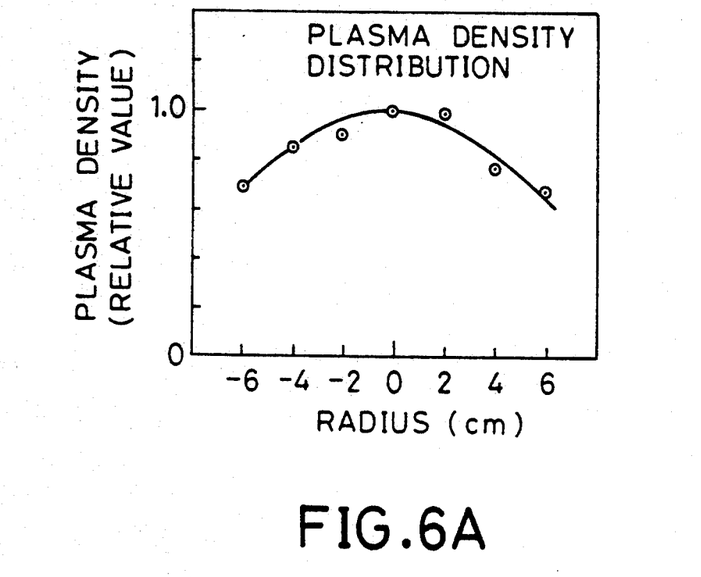
FIGS. 6A and 6B are diagrams illustrating the distribution of the plasma density and the thickness of the grown film, respectively, in the radial direction.
Figure 6B:
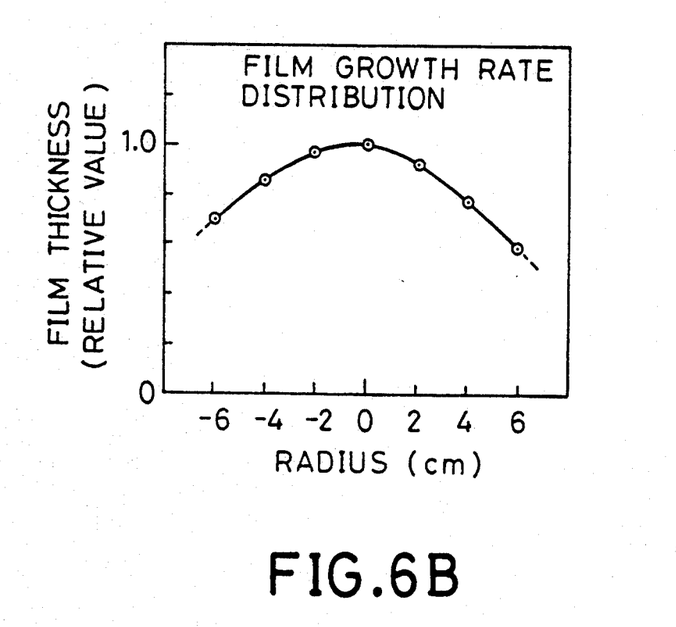

For example, the thin film grown over the surface of the substrate becomes more dense when the plasma density becomes greater, but when the plasma density becomes lesser, the film becomes coarse. Furthermore, the distribution of the thin film thickness is substantially similar to the plasma density distribution. FIGS. 6A and 6B illustrate the plasma density and film thickness, respectively, in the radial direction when, for example, the plasma of nitrogen is generated in accordance with the mode I and an $Si_3N_4$ film is grown over the surface of the substrate by introducing silane ($SiH_4$) into the processing chamber. As seen from FIGS. 6A and 6B, the distribution of the plasma density and the distribution of the film growth rate, that is the distribution of the thickness of the grown film, are in substantial correspondence. It follows, therefore, when it is desired to improve the film qualities and the film growth rate, it is preferable to grow the film with the mode I, while when it is desired to improve the distribution of the film thickness, it is preferable to grow the film with the mode II. In the case of the film growth, it suffices to operate the apparatus in such a way that the desired thin film quality and the distribution of the thickness of the grown film can be substantially obtained.

Figure 7:
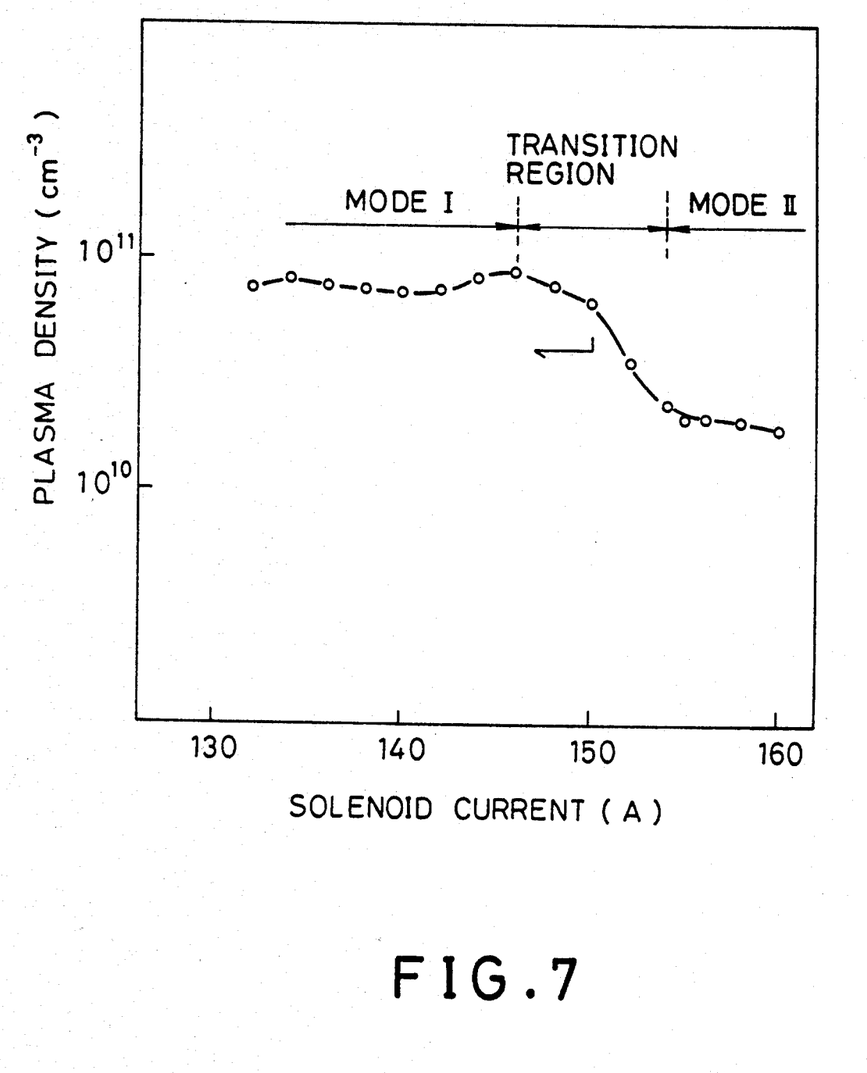
FIG. 7 is a diagram illustrating the dependence of the plasma density upon the excitation solenoid current.

FIG. 7 illustrates one example of the dependence of the density of the plasma generated in the plasma generation chamber upon the solenoid current. In this case, the plasma density is substantially uniform until the solenoid current rises to 146A. The range of such magnitude of the current corresponds to the mode I of the plasma generation, and in this mode the plasma is generated by the resonance magnetic field produced in the vicinity of the center in the axial direction of the excitation solenoid. When the solenoid current is increased, the plasma density drops suddenly. The decrease in such plasma density continues until the solenoid current reaches 154A and when the solenoid current is beyond 154A, the plasma density becomes substantially constant again. The range of the magnitude of the solenoid current in which the plasma density can be substantially maintained at a relatively low level corresponds the mode II of the plasma generation, in this mode the plasma is generated by the resonance magnetic field produced in the vicinity of the end of the excitation solenoid. The plasma density in the resonance magnetic field regions in the mode I is different from that in the mode II by one digit, i.e., about one power of ten. And there exists a transition region in which the plasma density varies in response to the magnitude of the solenoid current. The magnitudes of the solenoid current at the boundary between the transition region and the mode I and between the transition region and the mode II vary depending upon the shapes and sizes of the plasma generation chamber and of the excitation solenoid, but the three regions shown in FIG. 7 exist regardless of each dimension of the apparatus.

According to the conventional method for operating the plasma processing apparatus, the resonance magnetic field region is positioned at a preferable position within the transition region by controlling the magnitude of the solenoid current, whereby a thin film is grown. However, since the efficiency for plasma generation is greatly influenced by the position of the resonance magnetic field region relative to the microwave electric field strength distribution, or the relative to the position of the specific electric field strength, when the position of the excitation solenoid relative to the plasma generation chamber is maintained stationary, i.e., immovable, even if the position of the resonance magnetic field region, which is considered the preferable position in the transition region, is desired to be moved to a more optimum position, it is impossible to displace the resonance magnetic field region in the transition region. By contrast, according to the present invention, the plasma processing apparatus is so designed and constructed that the position of the excitation solenoid becomes movable relative to the plasma generation chamber, so that the magnitude of the solenoid current is determined at a value corresponding to the transition region and also the solenoid is moved in the axial direction of the plasma generation chamber so that the overall characteristics for processing the surface of the substrate can be increased to a higher level.

Figure 8:
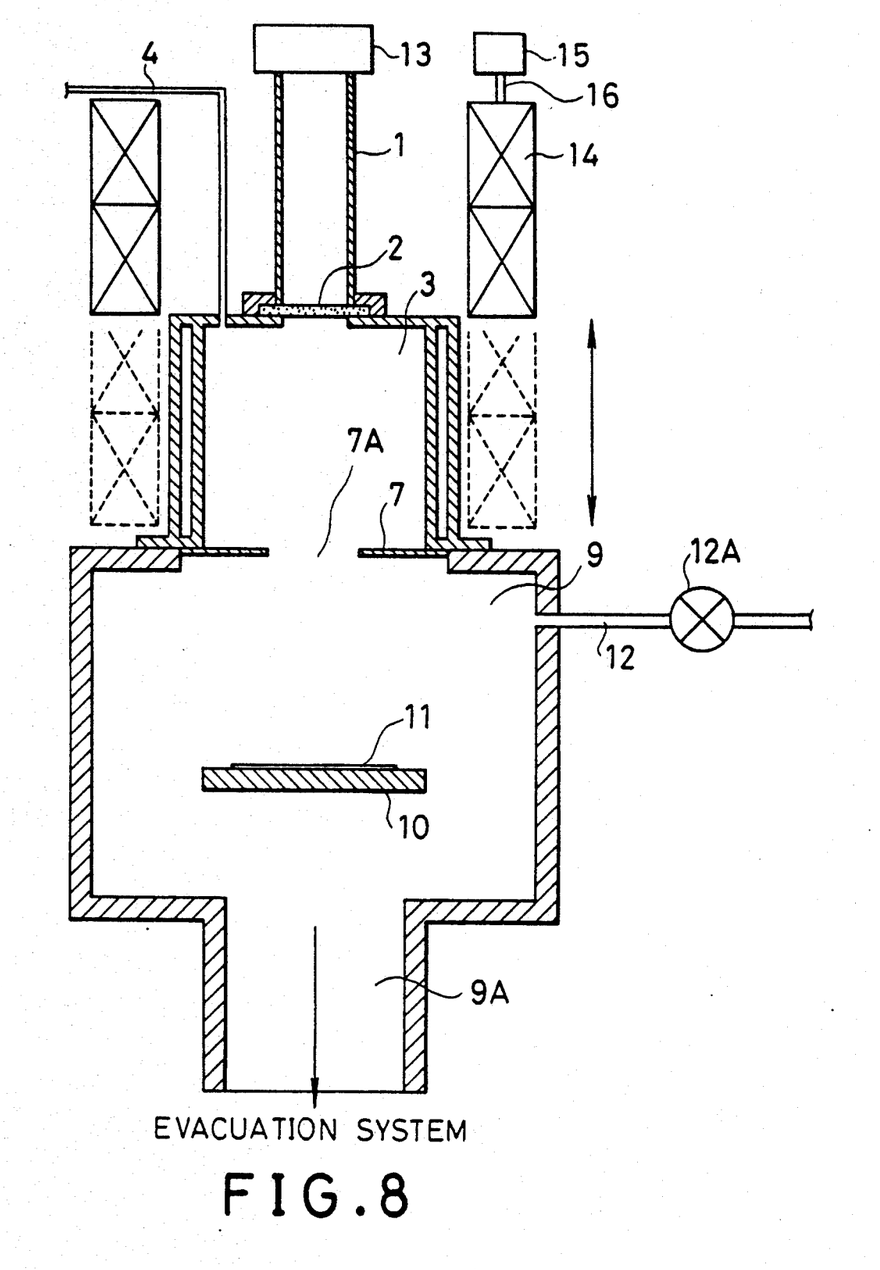
FIG. 8 is a schematic sectional view illustrating an embodiment of a plasma processing apparatus in accordance with the present invention.

FIG. 8 illustrates an embodiment of a plasma processing apparatus in accordance with the present invention. The same reference numerals are used to designate similar parts in both of FIGS. 1 and 8. The plasma generation chamber 3 and the processing chamber 9 are evacuated to a high vacuum through the exhaust port 9A of the processing chamber 9 by the evacuation system (not shown). Next, a predetermined gas such as Ar is introduced through the gas supply pipe 4 into the plasma generation chamber 3 in such a way that the pressure therein can be maintained at a predetermined level (for example, 1 to 10 mTorr). Next, microwaves is introduced into the plasma generation chamber 3 through the waveguide 1 and the vacuum window 2 from a microwave generating source 13 comprising a microwave oscillator, an isolator and a matching device, and so on, and the current is caused to flow through the excitation solenoid 14 so that the magnetic field which satisfies the ECR condition is created in the plasma generation chamber 3 which constitutes a resonator, thereby generating plasma.

The excitation solenoid 14 which surrounds the plasma generation chamber 3 coaxially thereof is vertically moved by a drive source 15, such as a motor, and a driving force transmission mechanism 16, such as a chain. A guide member for guiding the solenoid 14 may be disposed around the excitation solenoid 14. Instead of the chain, the driving force transmission mechanism 16 may use a gear, a screw or other suitable members. The guide member and the driving force transmission mechanism are made of a nonmagnetic material such as stainless steel. The resonance magnetic field region created inside the solenoid 14 by the current flowing therethrough can be displaced over the wide range in the axial direction of the plasma generation chamber 3 by the above-described vertical lifting mechanism so that the length in the axial direction of the solenoid can be shortened as compared with the conventional excitation solenoid, whereby the main body of the apparatus including the solenoid can be made compact in size.

In the case of processing the surface of the substrate 11, the excitation solenoid 14 is placed to a predetermined position. For instance, the position is so determined that the center position in the axial direction of the solenoid 14 substantially corresponds to the upper end of the plasma generation chamber 3. Thereafter, the electric current is made to flow through the solenoid in such a way that the magnetic field which satisfies the ECR condition can be created. In this case, while detecting the electron density by a conventional method, such as a probe method, the current is varied in magnitude and the magnitude of the current is determined at a level, this current level being within a range, while the magnitude of the current is increased the plasma density suddenly decreases as shown in FIG. 7. This magnitude of current exists between the magnitude of the current which defines the resonance magnetic field region where the plasma is generated by the mode I and the resonance magnitude of the current which defines the magnetic field region where the plasma is generated by the mode II. In other words, the magnitude of the current is such that the above-described transition region is defined. Next, the excitation solenoid 14 is vertically moved to and maintained at a position at which the magnitude of the current flowing through the excitation solenoid 14 can attain the optimum overall characteristics, such as the thin-film quality, the distribution of the film thickness thus grown, the film growth rate, and so on in the processing. Furthermore, the magnitude of the current is varied within the above-mentioned transition region, the above-described processing step is repeated for a few times so that the surface processing can attain the overall characteristics of the higher level. It must be noted here that the definition of the resonance magnetic field region at a desired position by adjusting the solenoid current can be made in a more stable manner by increasing the outer diameter, the thickness of the solenoid, to widen the transition region in the axial direction. As described above, according to the present invention, the overall characteristics such as the thin film growth rate, the thin film quality, the distribution of the thickness of a thin film, and so on, can be improved to the higher level and also in the case of the etching process, it becomes possible to carry out the surface processing which can raise the overall characteristics to the higher level.

The invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A method for operating a plasma processing apparatus which includes a plasma generation chamber into which is introduced a gas for generating plasma by a resonant effect between a microwave and a magnetic field, a processing chamber communicated with said plasma generation chamber, and a single excitation solenoid disposed to surround said plasma generation chamber in coaxial relationship therewith and movable relative to said plasma generation chamber, the method comprising:

generating plasma while controlling the magnitude of an electric current flowing through said single excitation solenoid to be in a range in which the density of the generated plasma is decreased with an increase of said current; and
  processing a specimen to be processed disposed within said processing chamber.

2. A method for operating a plasma processing apparatus which includes a plasma generation chamber into which is introduced a gas for generating plasma by a resonant effect between a microwave and a magnetic field, a processing chamber communicated with said plasma generation chamber, and a single excitation solenoid disposed to surround said plasma generation chamber in coaxial relationship therewith and movable relative to said plasma generation chamber, the method comprising:

generating plasma while controlling the magnitude of an electric current flowing through said single excitation solenoid to be in a range in which the density of the generated plasma is decreased with an increase of said current;
  processing a specimen to be processed disposed within said processing chamber;
  varying the magnitude of said current flowing through said single excitation solenoid within said range;
  changing the position of said single excitation solenoid in the axial direction thereof, and repeating said processing of said specimen;
  repeating said steps of varying the magnitude of the current, changing the position of said single excitation solenoid and processing said specimen;
  determining the magnitude of said current and said position of said single excitation solenoid; and
  processing said specimen.

3. A method for operating a plasma processing apparatus including microwave generation means for generating microwaves, microwave transmission means for transmitting the microwaves generated by said microwave generation means, a plasma generation chamber communicated with said microwave transmission means, said plasma generation chamber having gas supply means for introducing gas into said plasma generation chamber and having an opening defined at an end portion thereof in an opposing relationship with said microwave transmission means, a single excitation solenoid movably disposed around said plasma generation chamber in a coaxial relationship therewith and for defining a magnetic field for generating a plasma of the gas introduced into said plasma generation chamber by a resonant effect with said microwaves, a processing chamber communicated with said plasma generation chamber through said opening and for processing a surface of a substrate disposed therein with said plasma, and displacing means for varying the position of said single excitation solenoid in an axial direction relative to said plasma generation chamber, the method comprising the steps of:

(1) controlling a current flowing through said single excitation solenoid to form a resonance magnetic field which produces a plasma in a plasma density transition region, the transition region being between:

a first resonance magnetic field region located in the vicinity of a center of said single excitation solenoid, said first resonance magnetic field region having a plasma generation efficiency which is relatively high and having a plasma density which is relatively higher in the vicinity of a central axis of said plasma generation chamber than in the vicinity of a circumferential wall of said plasma generation chamber; and a second resonance magnetic field region located away from said center of said single excitation solenoid towards an end of said single excitation solenoid, said second resonance magnetic field region having a plasma generation efficiency which is relatively low as compared with said first resonance magnetic field region and having a plasma density distribution which is relatively homogeneous in a radial direction as compared with said first resonance magnetic field region;

(2) moving said resonance magnetic field forming said plasma density transition region to a predetermined optimal position relative to said plasma generation chamber; and (3) processing the surface of said substrate with said plasma.

4. The method according to claim 3, wherein the step of controlling a current flowing through said single excitation solenoid to form a resonance magnetic field which produces a plasma in a plasma density transition region comprises detecting electron density while varying said single excitation solenoid current to determine a point where plasma density decreases rapidly with an increase in solenoid current.

5. The method according to claim 4, wherein the step of detecting electron density comprises using a probe.

6. The method according to claim 3, wherein the step of moving the resonance magnetic field forming said plasma density transition region to a predetermined optimal position relative to said plasma generation chamber comprises mechanically moving said single excitation solenoid with said displacing means.

7. In a plasma processing apparatus for processing a semiconductor substrate, the apparatus having a plasma generation chamber communicating with a processing chamber for holding the substrate, a single excitation solenoid being disposed around the plasma generation chamber in a coaxial relationship therewith, and lift means for displacing said single excitation solenoid in a direction along an axis of said plasma generation chamber, a method for plasma processing the semiconductor substrate comprising:

generating a gas plasma by flowing a gas into the plasma generation chamber, introducing microwave radiation into the plasma generation chamber, and flowing a current through the single excitation solenoid for defining a magnetic field, thereby generating a gas plasma by a resonant effect between the magnetic field and the microwave radiation;

varying the current flowing through the single excitation solenoid to find a current range within which plasma density suddenly decreases with an increase in the current;

displacing said single excitation solenoid in a direction along a central axis thereof to a desired position and fixing the position thereof; and extruding plasma from the plasma generation chamber and directing the plasma onto a surface of the semiconductor substrate held in the processing chamber while maintaining the current within the current range so that the plasma processes the surface of the semiconductor substrate.

8. The method as claimed in claim 7, wherein said displacing and fixing at a desired position step is performed in accordance with an observed result of processing performance of said surface of the semiconductor substrate.

* * * * *

UNITED STATES PATENT AND TRADEMARK OFFICE
CERTIFICATE OF CORRECTION

PATENT NO. : 5,245,157
DATED : September 14, 1993
INVENTOR(S) : Kiyoshi OHIWA

It is certified that error appears in the above-indentified patent and that said Letters Patent is hereby corrected as shown below:

On the Title Page;
Item 54 - Please correct the Title to read --MICROWAVE PLASMA PROCESSING OF SEMICONDUCTOR DEVICES--.

Signed and Sealed this

Tenth Day of May, 1994

Attest:

BRUCE LEHMAN

Attesting Officer          Commissioner of Patents and Trademarks